(12) United States Patent
Kim et al.

(10) Patent No.: US 11,932,933 B2
(45) Date of Patent: Mar. 19, 2024

(54) COOLING DEVICE AND PROCESS FOR COOLING DOUBLE-SIDED SIP DEVICES DURING SPUTTERING

(71) Applicant: STATS ChipPAC Pte. Ltd., Singapore (SG)

(72) Inventors: OhHan Kim, In-cheon (KR); HunTeak Lee, Gyeongi-do (KR); Sell Jung, Incheon (KR); HeeSoo Lee, Kyunggi-do (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 0 days.

(21) Appl. No.: 17/814,796

(22) Filed: Jul. 25, 2022

(65) Prior Publication Data

US 2022/0364222 A1 Nov. 17, 2022

Related U.S. Application Data

(62) Division of application No. 17/032,437, filed on Sep. 25, 2020, now Pat. No. 11,434,561.
(Continued)

(51) Int. Cl.
| | |
|---|---|
| *C23C 14/50* | (2006.01) |
| *C23C 14/34* | (2006.01) |
| *H01L 23/00* | (2006.01) |
| *H01L 23/498* | (2006.01) |
| *H01L 23/552* | (2006.01) |

(52) U.S. Cl.
CPC .............. *C23C 14/50* (2013.01); *C23C 14/34* (2013.01); *H01L 23/49838* (2013.01); *H01L 23/552* (2013.01); *H01L 24/16* (2013.01); *H01L 2224/16227* (2013.01); *H01L 2924/19105* (2013.01); *H01L 2924/19106* (2013.01); *H01L 2924/3025* (2013.01)

(58) Field of Classification Search
None
See application file for complete search history.

(56) References Cited

U.S. PATENT DOCUMENTS

| 7,580,261 B2 | 8/2009 | Smith et al. |
| 7,833,023 B2 | 11/2010 | Di Stefano et al. |
| (Continued) | | |

FOREIGN PATENT DOCUMENTS

| CN | 101040059 A | 9/2007 |
| CN | 107000092 A | 8/2017 |
| (Continued) | | |

*Primary Examiner* — Long Pham
(74) *Attorney, Agent, or Firm* — Brian M. Kaufman; Robert D. Atkins; PATENT LAW GROUP: Atkins and Associates, P.C.

(57) ABSTRACT

A semiconductor manufacturing device has a cooling pad with a plurality of movable pins. The cooling pad includes a fluid pathway and a plurality of springs disposed in the fluid pathway. Each of the plurality of springs is disposed under a respective movable pin. A substrate includes an electrical component disposed over a surface of the substrate. The substrate is disposed over the cooling pad with the electrical component oriented toward the cooling pad. A force is applied to the substrate to compress the springs. At least one of the movable pins contacts the substrate. A cooling fluid is disposed through the fluid pathway.

23 Claims, 7 Drawing Sheets

Related U.S. Application Data (60) Provisional application No. 63/001,213, filed on Mar. 27, 2020.

(56) References Cited

U.S. PATENT DOCUMENTS

| | | |
|---|---|---|
| 9,210,831 B2 | 12/2015 | Arvelo et al. |
| 10,679,845 B2 * | 6/2020 | Inadomi ............ H01L 21/68785 |
| 11,452,225 B2 * | 9/2022 | Prajuckamol ...... H05K 7/20254 |
| 2001/0028552 A1 * | 10/2001 | Letourneau ......... H01L 23/4093 |
| | | 257/E23.086 |
| 2004/0188062 A1 | 9/2004 | Belady et al. |
| 2006/0075969 A1 | 4/2006 | Fischer |
| 2017/0256398 A1 * | 9/2017 | Inadomi ............ H01L 21/67109 |
| 2017/0326665 A1 * | 11/2017 | Oetzel .................. B23K 1/0016 |
| 2019/0390911 A1 * | 12/2019 | Bunch ................ H05K 7/20372 |
| 2020/0033075 A1 * | 1/2020 | Veto ................... H05K 7/20254 |
| 2023/0163048 A1 * | 5/2023 | Wang .................. H01L 23/3672 |
| | | 257/713 |

FOREIGN PATENT DOCUMENTS

| | | |
|---|---|---|
| CN | 110785051 A | 2/2020 |
| JP | H0661670 A | 3/1994 |

\* cited by examiner

COOLING DEVICE AND PROCESS FOR COOLING DOUBLE-SIDED SIP DEVICES DURING SPUTTERING

CLAIM TO DOMESTIC PRIORITY

The present application is a division of U.S. patent application Ser. No. 17/032,437, now U.S. Pat. No. 11,434,561, filed Sep. 25, 2020, which claims the benefit of priority of U.S. Provisional Application No. 63/001,213, filed Mar. 27, 2020, which applications are incorporated herein by reference.

FIELD OF THE INVENTION

The present invention relates in general to semiconductor manufacturing and, more particularly, to a device and method for cooling double-sided system-in-package (SiP) devices during sputtering.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are often susceptible to electromagnetic interference (EMI), radio frequency interference (RFI), harmonic distortion, or other inter-device interference, such as capacitive, inductive, or conductive coupling, also known as cross-talk, which can interfere with their operation. The high-speed switching of digital circuits also generates interference.

Conductive layers can be formed over semiconductor packages to shield electronic parts within the package from EMI and other interference. Shielding layers absorb EMI before the signals can hit semiconductor die and discrete components within the package, which might otherwise cause malfunction of the device. Shielding layers are also formed over packages with components that are expected to generate EMI to protect nearby devices.

The shielding layers are commonly formed by sputtering, which generates a significant amount of heat. Unfortunately, increasing the temperature of a package during sputtering can cause several problems, such as remelting of solder, extrusion, warpage, or material damage. Therefore, semiconductor packages are typically disposed on a cooling pad during sputtering to keep the package under 150-200 degrees Celsius (° C.). Staying below 200° C. is generally satisfactory, but staying below 150° C. is preferred.

Figure 1:
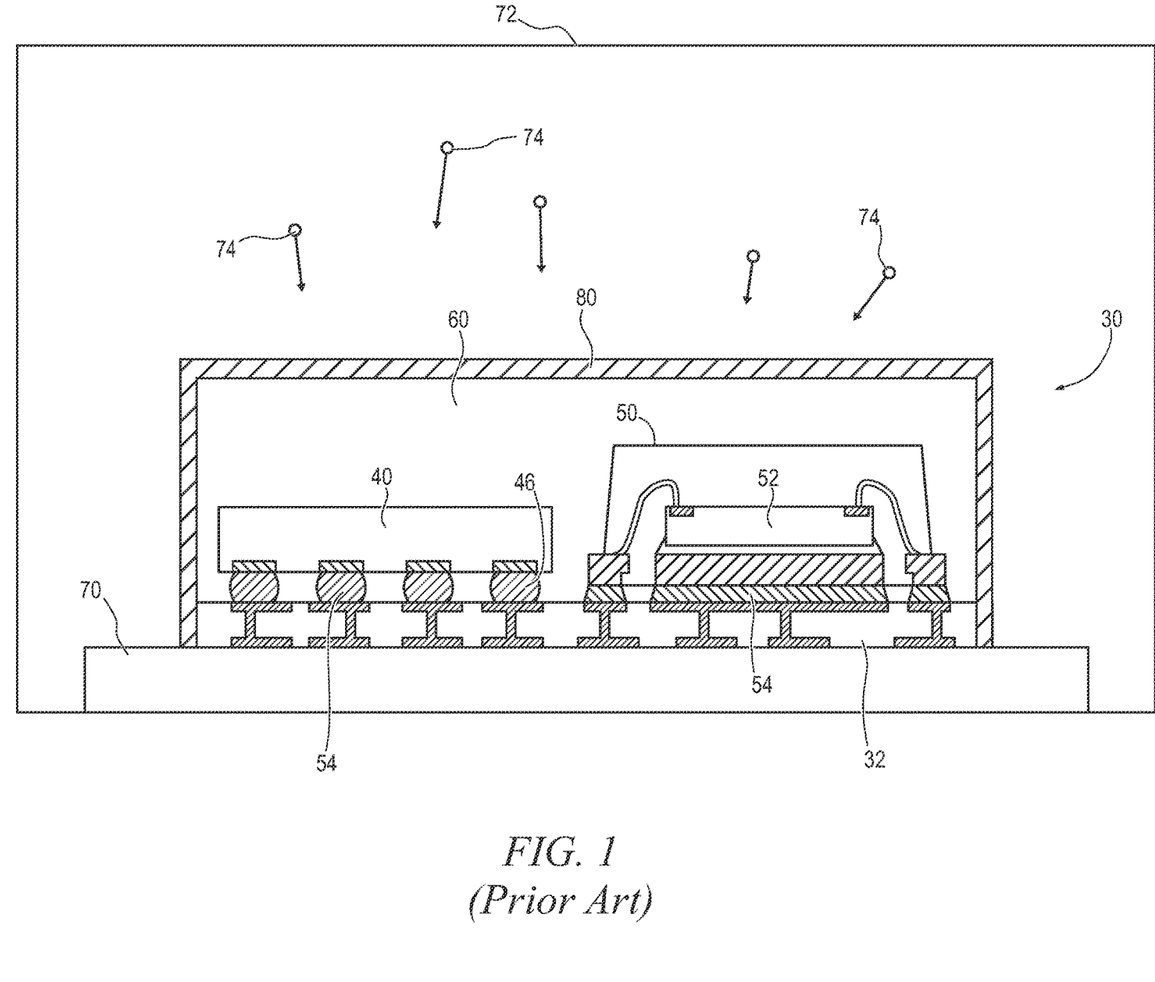
FIG. 1 illustrates sputtering a semiconductor package.

FIG. 1 illustrates a semiconductor package 30 being sputtered to add a shielding layer. Package 30 includes a package substrate 32. A semiconductor die 40, sub-package 50 with semiconductor die 52, and other surface mount components are disposed on substrate 32 to provide the electrical functionality of package 30. Solder 54 is used to physically and electrically couple semiconductor die 40 and sub-package 50 to substrate 32. Melting of solder 54 during sputtering could cause discontinuities in the electrical connections to substrate 32.

An encapsulant or molding compound 60 is deposited over substrate 32, die 40, and sub-package 50. After encapsulation, package 30 is disposed on cooling pad 70 within sputtering machine 72. Package 30 is bombarded with metal molecules 74, e.g. copper, within sputtering machine 72 to build up a conductive shielding layer 80. The temperature within sputtering machine 72 stays around 400° C. during sputtering, and thermal energy is constantly added to package 30 while sputtering is ongoing. Substrate 32 lies flat on cooling pad 70 for good thermal contact between package 30 and the cooling pad. Cooling pad 70 is made of a flexible material to tightly adhere to the bottom surface of substrate 32. Cooling pad 70 withdraws thermal energy through substrate 32 to keep package 30 below a desired target temperature.

Figure 2:
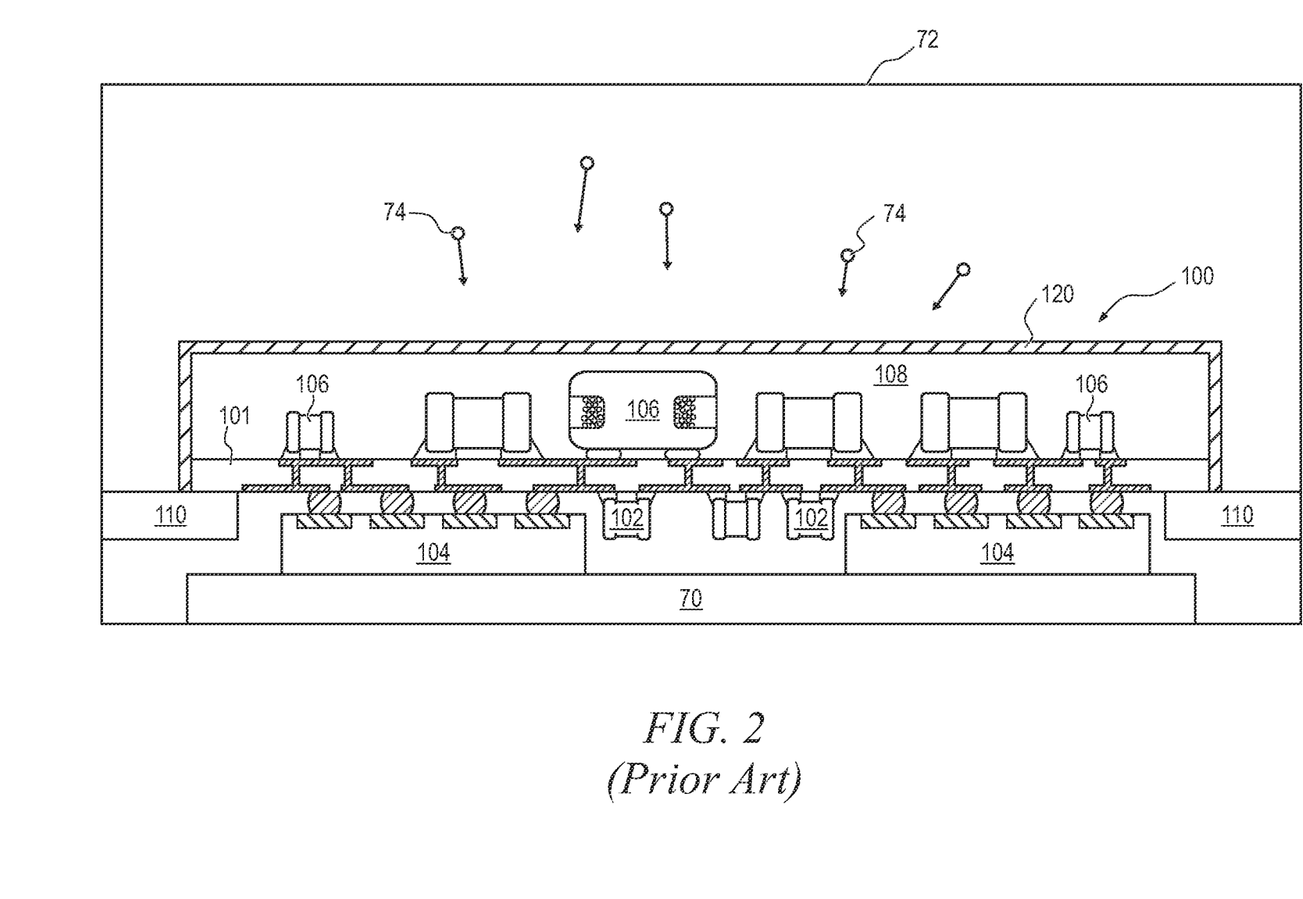
FIG. 2 illustrates sputtering a double-side system-in-package device.

Newer packaging types, such as system-in-package devices, commonly use surface mount components on both sides of a package substrate as shown with package 100 in FIG. 2. Substrate 101 of package 100 has passive components 102 and semiconductor die 104 mounted on the bottom surface and passive components 106 mounted on the top surface. Any combination of components can be disposed on any surface of substrate 101. Encapsulant 108 is deposited over substrate 101 and components 106. A frame 110 holds package 100 in sputtering machine 72 while the sputtering process deposits shielding layer 120 over encapsulant 108.

As with package 30 in FIG. 1, package 100 is disposed on cooling pad 70. However, due to components 102 and 104 on the bottom surface, substrate 101 does not directly contact cooling pad 70. Thermal energy can only be withdrawn from components 106 via semiconductor die 104. Not having direct contact with substrate 101 reduces the rate of thermal energy being extracted from the top part of package 100 and means that the temperature of the package is unlikely to remain satisfactory. Package 100 has a high likelihood of manufacturing defects being introduced during sputtering because of the elevated temperature. Therefore, a need exists for an improved cooling mechanism usable with double-sided SiP devices.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding compound is deposited over the package to provide physical support and electrical isolation. The finished package is then inserted into an electrical system and the functionality of the semiconductor device is made available to the other system components.

Figure 3A:
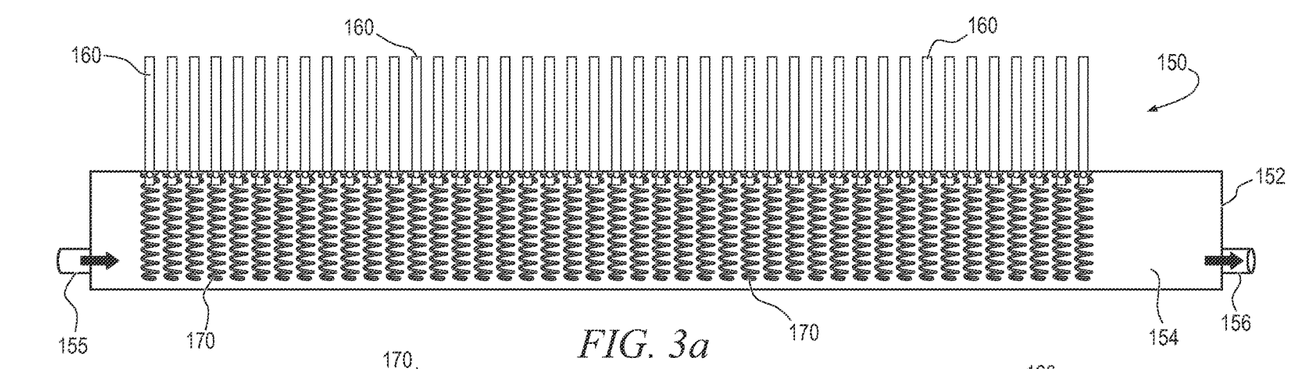
FIGS. 3a-3c illustrate a cooling pad having movable pins.

Electromagnetic interference (EMI) shielding layers are commonly formed over semiconductor packages as part of back-end manufacturing. As explained above, sputtering machines used to form the shielding layers generate heat that can cause manufacturing defects. FIG. 3a illustrates a cooling pad 150 with movable pins 160 that can be used in a sputtering machine to keep double-sided system-in-package (SiP) devices sufficiently cool. Cooling pad 150 has a base 152 with a fluid pathway 154 running through the base. During use, a cooling fluid flows through fluid pathway 154 to carry away thermal energy. The cooling fluid can be a chemical coolant, refrigerant, water, oil, gas, or any other suitable fluid.

Pins 160 extend through openings in the top of base 152 so that the top of the pins are outside of the base and the bottoms of the pins are within fluid pathway 154. The opening in base 152 are just large enough to allow pins 160 to move in the openings without leaking fluid through the openings. In some embodiments, a grommet or other mechanism is used to seal the opening around pins 160. Pins 160 are formed from a metal, such as copper, aluminum, or gold, or a polymer having high thermal conductivity, or another material having suitable thermal conductivity.

Pins 160 are spring-loaded with springs 170 so that the pins can be pressed into fluid pathway 154 by a package to be cooled. Springs 170 are formed from any suitable material, such as those mentioned above for pins 160. Springs 170 can be made of a thermally conductive material to aid in thermal transfer to the cooling fluid. After the package is removed, pins 160 spring back out to the position shown in FIG. 3a. In some embodiments, an elastic material that stretches is used instead of coiled springs. Any suitable elastic mechanism can be used to return pins 160 to their fully extended position.

Figure 3B:
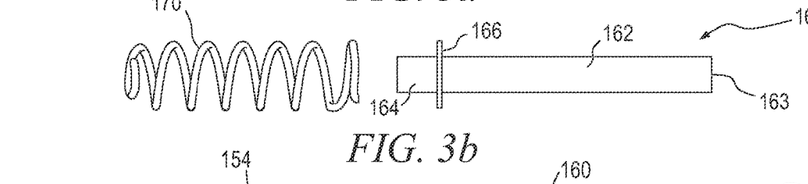

FIG. 3b shows a pin 160 and spring 170 separated from base 152. Pin 160 includes a top portion 162 with a tip 163. Top portion 162 is the portion of pin 160 that extends outside of base 152. A bottom portion 164 of pin 160 is the portion that is disposed within fluid pathway 154. Bottom portion 164 extends into spring 170 to keep the spring on the pin within base 152. In one embodiment, top portion 162 and bottom portion 164 are of a uniform cross-section when viewed from tip 163. In other embodiments, bottom portion 164 is thinner, thicker, or differently shaped than top portion 162 and may be simply a small bump on the bottom of the pin. In some embodiments, spring 170 extends into a groove on the bottom of pin 160 rather than around a bump. Fluid pathway 154 optionally has bumps or other structures on the bottom of the fluid pathway for holding the opposite ends of springs 170.

Pin 160 includes a flange 166 formed around the pin between top portion 162 and bottom portion 164. Flange 166 serves dual purposes, to both keep pin 160 within base 152 and to allow the pin to interact with spring 170. When a package to be cooled presses down on tip 163 of pin 160, the pin moves downward into base 152. Flange 166 presses against the top of spring 170 as pin 160 moves downward, thereby compressing the spring. When the package is removed from cooling pad 150, springs 170 decompress and press against flange 166 to move the pin back upward. Eventually, flange 166 hits the top of fluid pathway 154 and springs 170 stop decompressing. Flange 166 keeps spring 170 from undesirably pushing pin 160 completely out of base 152.

Flange 166 is a disk having a common center with top portion 162 and bottom portion 164. Flange 166 has a circular shape with a circumference extending completely around pin 160. In other embodiments, flange 166 is simply two dowels or bumps extending in opposite directions from the pin. One dowel or bump on only one side of pin 160 is used in other embodiments. Having a flange 166 that does not extend in all directions from the center of pin 160 allows adjacent pins to be disposed closer together. The discrete flange 166 portions of adjacent pins 160 can be positioned offset from each other so that the pins can be formed within the distance of a single flange width of each other, rather than having to be spaced by two flange widths. No flange is necessary in embodiments where spring 170 extends into a groove on the bottom of pin 160, or if the springs otherwise apply force to the bottom of the pins. A tab of base 152 can extend into pin 160 to keep the pins within the base, rather than relying on flange 166 hitting the top of fluid pathway 154.

Figure 3C:
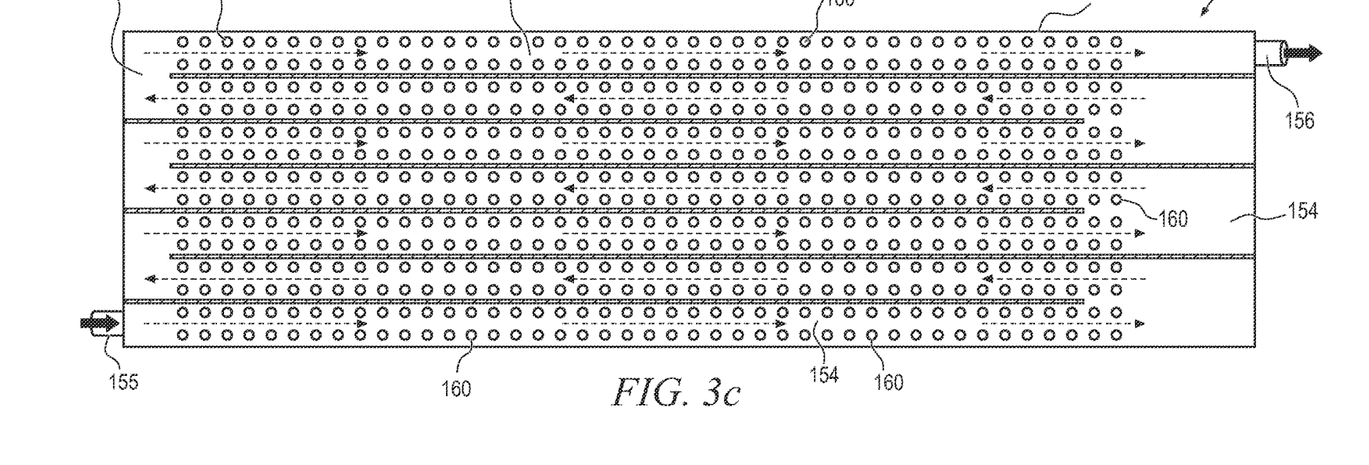

FIG. 3c illustrates a top-down plan view of cooling pad 150 with base 152 cross-sectioned to show fluid pathway 154 with a serpentine shape. The footprint of cooling pad 150 can be expanded to accommodate any sized semiconductor package, or a multi-device panel that will be singulated after sputtering. Cooling fluid flows back and forth across the entire width of base 152 multiple times to get from fluid inlet 155 to fluid outlet 156. The serpentine shape of fluid pathway 154 forces the cooling fluid to flow across each pin 160 and spring 170 with substantially equal volume per unit time. In other embodiments, fluid pathway 154 is one large chamber, multiple parallel paths, or any other suitable shape.

Figure 4:
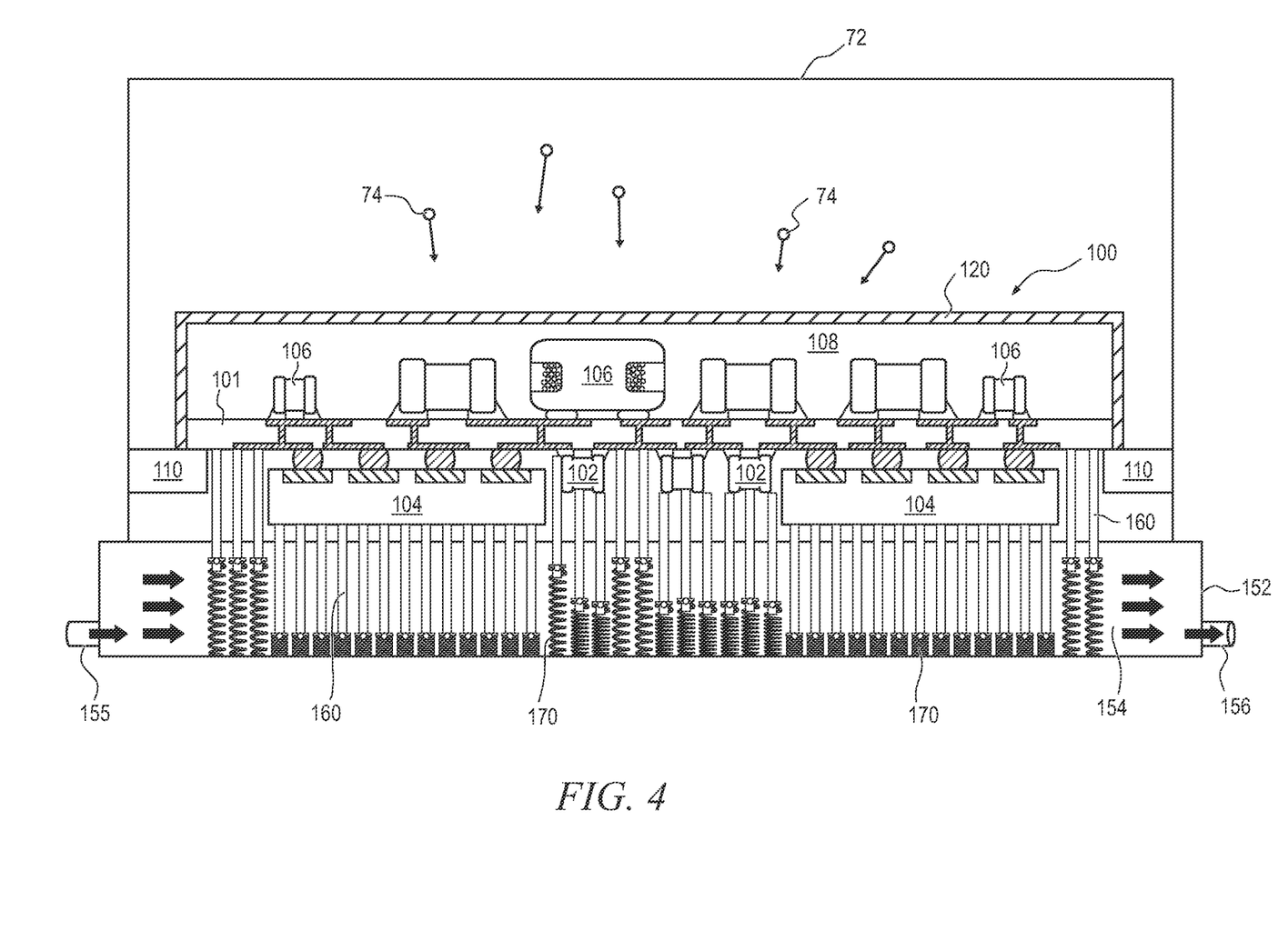
FIG. 4 illustrates the double-sided system-in-package device in a sputtering machine with the cooling pad having movable pins.

FIG. 4 shows cooling pad 150 disposed in sputtering machine 72 with double-sided SiP device 100 disposed on the cooling pad. SiP device 100 is pressed down onto pins 160. Tips 163 of pins 160 press against SiP device 100 as the SiP device is pressed downward. Each pin 160 is pressed down a certain distance depending on what portion of SiP device 100 is directly over the particular pin. Pins 160 directly under die 104 are pressed down the most, such that springs 170 are fully or nearly fully compressed. Pins 160 that are directly under discrete components 102 are not pressed down as far as pins under die 104 but still have tips 163 that are pressed against the discrete components by springs 170.

Pins 160 that are not under any components on the bottom of substrate 101 have tips 163 pressing against the bottom surface of the substrate. The pins 160 that contact substrate 101 still compress respective springs 170 somewhat so that the pins apply some force against the substrate. In other embodiments, substrate 101 is positioned to rest in contact with pins 160 without compressing respective springs 170.

Pins 160 draw thermal energy from SiP device 100 through physical contact. Because the heights of pins 160 adjust based on the shape of the bottom of a package being sputtered, the pins provide physical contact of the cooling surface for a much larger surface area than prior art cooling pads. Pins 160 not only draw thermal energy from die 104, but also directly from substrate 101 and discrete components 102.

Pins 160 transfer thermal energy down to within fluid pathway 154 where the thermal energy is further transferred to the cooling fluid and carried away by the flow. Thermal energy is also transferred from pins 160 to springs 170, which helps present a larger surface area to the flow of cooling fluid due to the coiled shape. All pins contact the bottom of package 100, which provides sufficient thermal capacity to keep the package under 150-200° C. In one embodiment, top portion 162 of each pin is made at least as long, from flange 166 to tip 163, as the tallest expected device to be disposed on the bottom side of a package being sputtered so that in all expected cases pins 160 are able to physically contact substrate 101.

Figure 5:
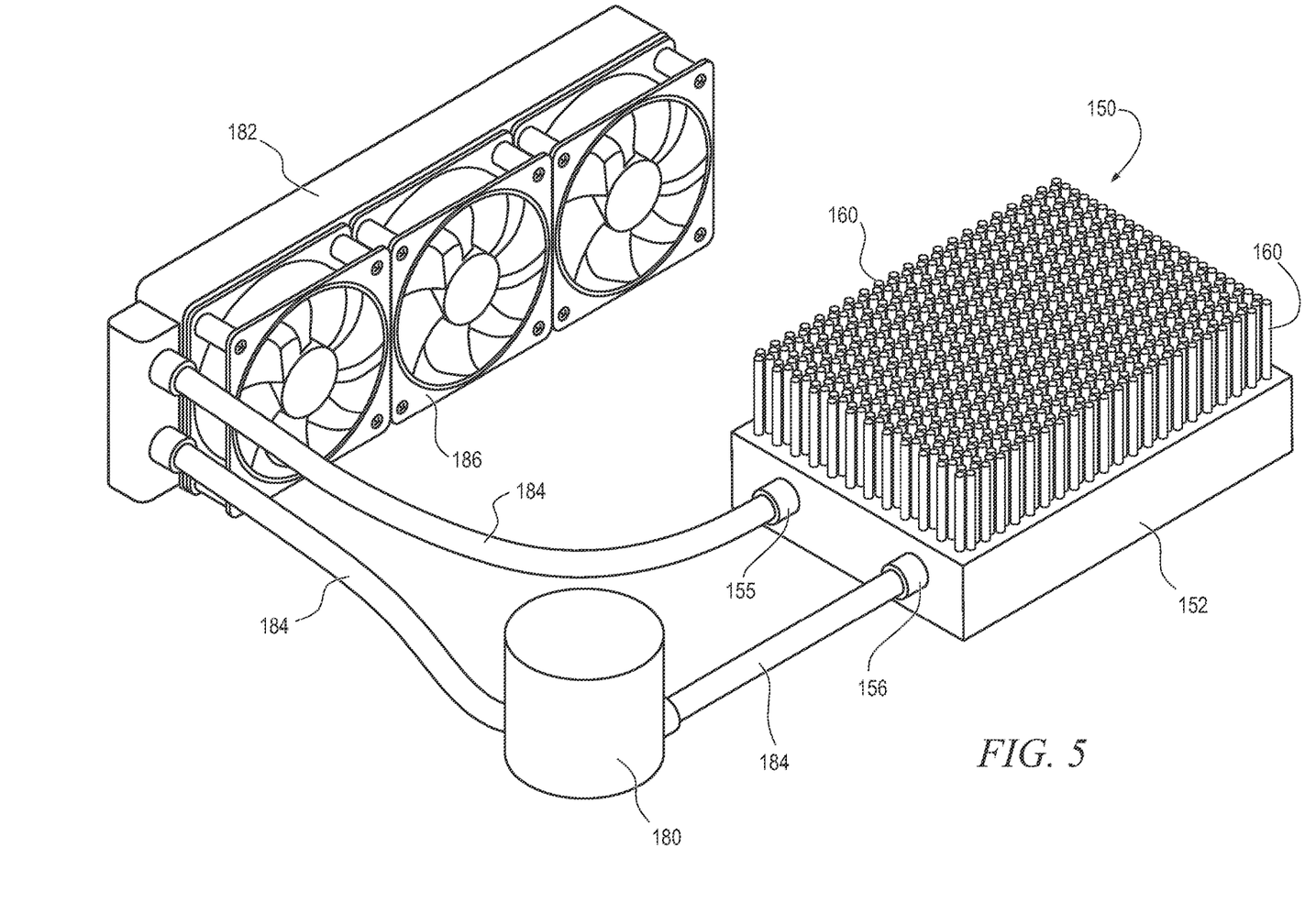
FIG. 5 illustrates a cooling circuit including the cooling pad having movable pins.

FIG. 5 illustrates a full cooling loop with cooling pad 150, pump 180, and radiator 182 coupled in a fluid circuit via tubes 184. Pump 180 creates a pressure differential between an input and output of the pump to propel fluid through the system. In the illustrated configuration, pump 180 pulls cooling fluid from base 152 via outlet 156 and a first tube 184, and then pushes the fluid into radiator 182 via a second tube 184. The fluid flows through radiator 182 and then back to inlet 155 of cooling pad 150 via a third tube 184. Radiator 182 has fans 186 attached to push air through the radiator and cool off the fluid. Radiator 182 includes a fluid pathway and several fins that are warmed by the cooling fluid. Fans 186 blow ambient air through the radiator across the fins to transfer thermal energy from the fins to the ambient air. Cooling fluid is returned to base 152 via tube 184 to absorb more thermal energy from package 100 via pins 160.

Any type of thermal heat exchanger can be used instead of a radiator as illustrated. In some embodiments, electrically powered Peltier coolers are used. One embodiment utilizes a refrigeration cycle to cool base 152. The refrigeration cycle uses a refrigerant as the cooling fluid, and has a compressor, condenser, and expansion valve as part of the fluid circuit. Base 152 acts like an evaporator for the system and cools off pins 160 as part of the evaporation process. Base 152 may need a modified structure to properly act as an evaporator in the refrigeration cycle. Any type of heat exchangers can be used for radiator 182 and base 152. Base 152 exchanges heat from package 100 to the cooling fluid. Radiator 182 exchanges heat from the cooling fluid to ambient air or another medium.

Figure 6:
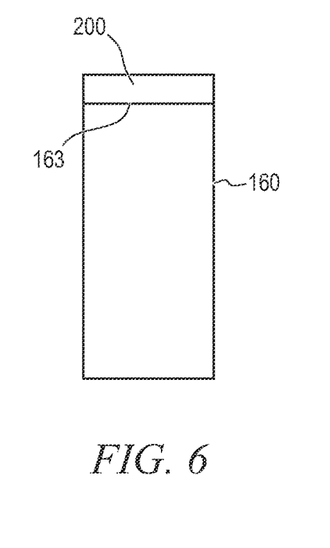
FIG. 6 illustrates a coating formed on top of the movable pins.

FIG. 6 illustrates a pin 160 with a surface coating 200 on tip 163 of the pin. Pins 160 of cooling pad 150 optionally have surface coating 200 made of a damping material, such as silicone or polytetrafluoroethylene (PTFE). Surface coating 200 reduces friction and softens tip 163, which reduces the likelihood of damage to the device being cooled and helps accommodate slight lateral movements of the device relative to the pins.

Figure 7A:
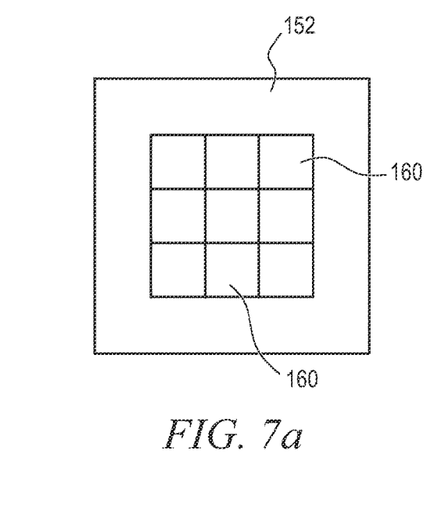
FIGS. 7a-7d illustrate movable pins disposed in physical contact with each other and a coating on the sides of the movable pins to reduce friction.
Figure 7B:
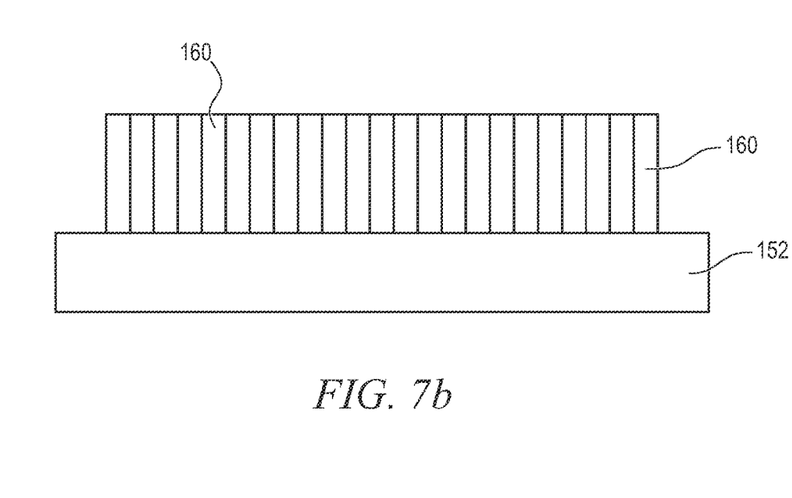
Figure 7C:
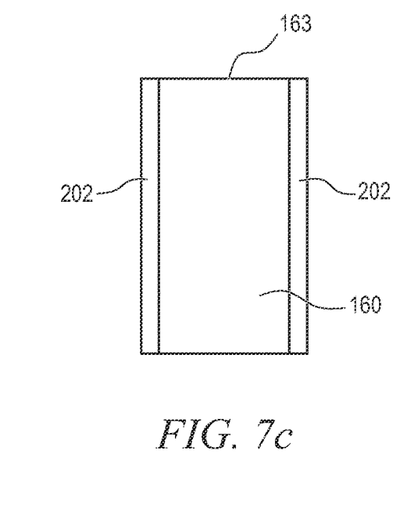
Figure 7D:
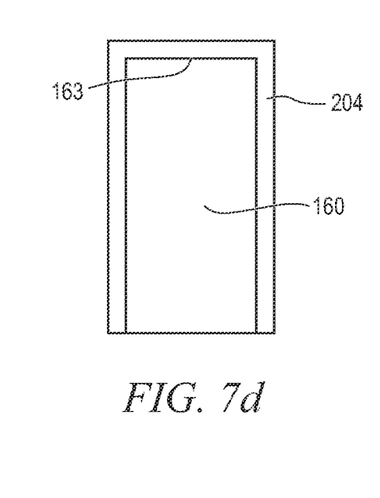

In some embodiments, the gap between adjacent pins 160 becomes nearly zero, as shown in FIGS. 7a and 7b. FIG. 7a is a top-down plan view while FIG. 7b is a side view. For such embodiments, pins 160 are close enough that adjacent pins are likely to physically contact each other during use. FIG. 7c shows a coating 202 formed on the side surfaces all the way around pin 160. Coating 202 can be formed from PTFE or another low-friction material that allows pins 160 to slide against each other. FIG. 7d shows a pin 160 with coating 204 formed both on the side surfaces and also on tip 163. Coating 204 provides the benefits of both coating 200 and coating 202. Alternatively, coating 200 and coating 202 can be formed separately from the same or two different materials on pins 160.

Figure 8A:
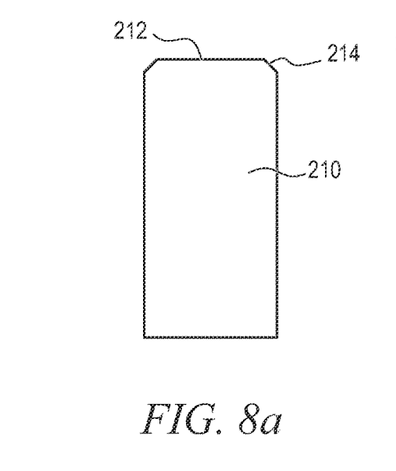
FIGS. 8a and 8b illustrate different shapes for the tips of the movable pins.
Figure 8B:
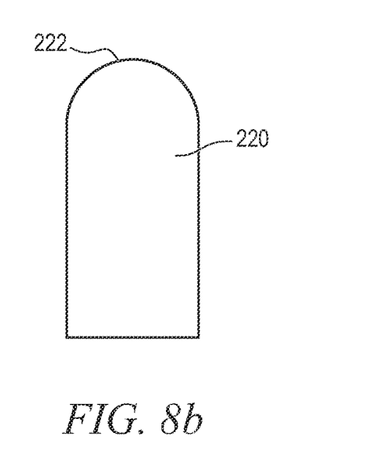

Pins can be made with a wide variety of shapes. FIGS. 8a and 8b illustrate different tip shapes for pins. FIG. 8a shows pin 210 with a beveled tip 212. A beveled surface 214 provides a transition from the side surface to the top surface. The edges of tip 212 can be rounded instead. FIG. 8b illustrates a pin 220 with the entire tip 222 rounded. Rounded or beveled tips reduce the likelihood of damage from sharp tip corners and help the pins conform to angled surfaces.

Figure 9A:
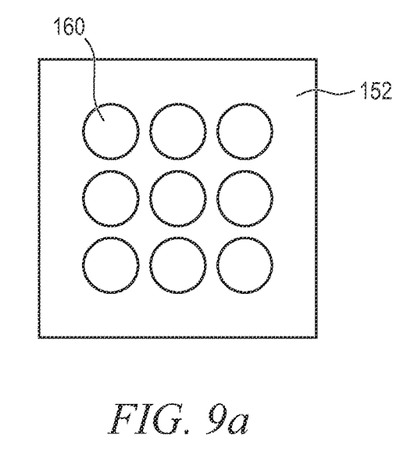
FIGS. 9a-9d illustrate different shapes for the footprints of the movable pins.
Figure 9B:
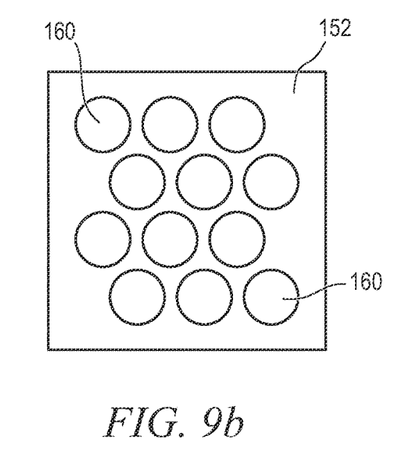
Figure 9C:
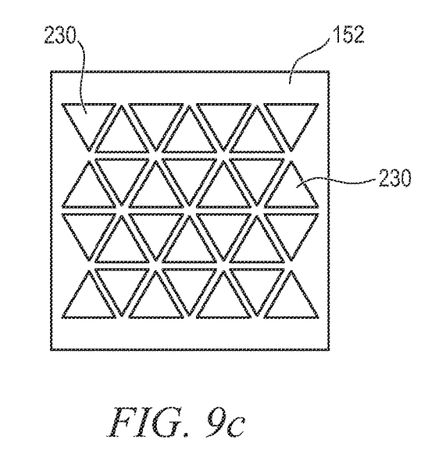

Pins can also be formed with a wide variety of profile shapes in plan view, as well as a variety of layouts within base 152. FIG. 9a shows round pins 160 oriented in a regular grid on base 152. FIG. 9b shows round pins 160 with rows of pins offset from each other. Rows being offset allows more round pins 160 to be placed in the same footprint area of base 152. FIG. 9c shows pins 230 with triangular profile shapes. The triangular pins can have all three side surfaces of each pin facing another adjacent pin so that nearly the entire surface of base 152 is covered in pins.

Figure 9D:
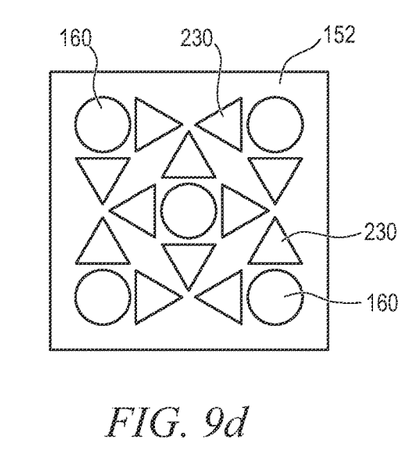

Pins can have any desired profile shape in footprint view, e.g., rectangular, triangular, circular, etc. Multiple different shapes of pins can be used together on a single cooling pad, e.g., circular pins 160 and triangular pins 230 are used together in FIG. 9d. Each circular pin 160 is surrounded by a triangular pin 230 on each cardinal direction from the circular pin. The size, footprint shape, tip shape, and layout of pins is not limited.

While one or more embodiments of the present invention have been illustrated in detail, the skilled artisan will appreciate that modifications and adaptations to those embodiments may be made without departing from the scope of the present invention as set forth in the following claims. While the description is drafted in terms of cooling during sputtering, the described cooling pad with movable pins can be used to cool any device in any situation.

What is claimed:

1. A semiconductor device, comprising:
a cooling pad including a plurality of movable pins, wherein the cooling pad includes a fluid pathway and a plurality of springs disposed in the fluid pathway with each of the plurality of springs disposed under a respective movable pin;
a substrate disposed over the cooling pad;
an electrical component mounted to the substrate between the substrate and cooling pad, wherein the springs are compressed and at least one of the movable pins contacts the substrate; and
a cooling fluid disposed in the fluid pathway.

2. The semiconductor device of claim 1, further including a conductive layer sputtered over the substrate.

3. The semiconductor device of claim 1, further including a heat exchanger with a portion of the cooling fluid disposed in the heat exchanger.

4. The semiconductor device of claim 1, further including a coating formed over the plurality of movable pins.

5. The semiconductor device of claim 4, wherein a first movable pin of the plurality of movable pins contacts a second movable pin of the plurality of movable pins.

6. The semiconductor device of claim 1, wherein each of the plurality of movable pins includes a flange disposed in the fluid pathway.

7. A semiconductor device, comprising:
a cooling pad including a plurality of movable pins; and
a substrate including a component disposed over a surface of the substrate, wherein the substrate is disposed over the cooling pad with a first movable pin contacting the component and a second movable pin contacting the substrate.

8. The semiconductor device of claim 7, further including:
a first spring disposed in the cooling pad under the first movable pin; and
a second spring disposed in the cooling pad under the second movable pin.

9. The semiconductor device of claim 7, further including a cooling fluid disposed in the cooling pad.

10. The semiconductor device of claim 9, further including a heat exchanger with a portion of the cooling fluid disposed in the cooling pad.

11. The semiconductor device of claim 7, further including a conductive layer formed over the substrate.

12. The semiconductor device of claim 7, further including a coating formed on top surfaces of the plurality of movable pins.

13. The semiconductor device of claim 7, further including a coating formed on side surfaces of the plurality of movable pins.

14. A semiconductor device, comprising:
a cooling pad;
a fluid pathway formed in the cooling pad;
a cooling fluid disposed in the cooling pathway;
a plurality of pins extending from within the fluid pathway to outside the cooling pad; and
a plurality of springs with a spring of the plurality of springs disposed in the cooling pad under each of the plurality of pins.

15. The semiconductor device of claim 14, further including a heat exchanger coupled to the cooling pad.

16. The semiconductor device of claim 14, further including a substrate disposed over the cooling pad with a component of the substrate contacting one of the plurality of pins.

17. The semiconductor device of claim 14, further including a coating formed on a top surface of the plurality of pins.

18. The semiconductor device of claim 14, further including a coating formed on a side surface of the plurality of pins.

19. A semiconductor device, comprising:
a cooling pad;
a fluid pathway formed in the cooling pad;
a pin extending from within the fluid pathway to outside the cooling pad; and
a spring disposed in the cooling pad under the pin.

20. The semiconductor device of claim 19, further including a heat exchanger coupled to the cooling pad.

21. The semiconductor device of claim 19, further including a substrate disposed over the cooling pad with a component of the substrate contacting the pin.

22. The semiconductor device of claim 19, further including a coating formed on a surface of the pin.

23. The semiconductor device of claim 19, further including a plurality of pins extending from within the fluid pathway to outside the cooling pad.

* * * * *